US005635333A

United States Patent [19]
Petersen et al.

[11] Patent Number: 5,635,333
[45] Date of Patent: Jun. 3, 1997

[54] ANTIREFLECTIVE COATING PROCESS

[75] Inventors: John S. Petersen; Kim R. Dean, both of Austin; Daniel A. Miller, Round Rock, all of Tex.

[73] Assignees: Shipley Company, L.L.C., Marlboro, Mass.; Sematech, Inc., Austin, Tex.

[21] Appl. No.: 365,198

[22] Filed: Dec. 28, 1994

[51] Int. Cl.$^6$ .................................................. G03C 1/825
[52] U.S. Cl. .................. 430/311; 430/325; 430/326; 430/328; 430/330; 430/510; 430/512; 430/513; 430/514
[58] Field of Search .......................... 430/510, 512, 430/311, 313, 325, 326, 328, 330, 513, 514

[56] References Cited

U.S. PATENT DOCUMENTS

| | | | |
|---|---|---|---|
| 4,370,405 | 1/1983 | O'Toole et al. | 430/312 |
| 4,668,606 | 5/1987 | DoMinh et al. | 430/271 |
| 4,719,166 | 1/1988 | Blevins et al. | 430/166 |
| 4,822,718 | 4/1989 | Latham et al. | 430/271 |
| 4,828,960 | 5/1989 | Hertog | 430/191 |
| 4,910,122 | 3/1990 | Arnold et al. | 430/313 |
| 5,498,514 | 3/1996 | Nakao et al. | 430/512 |

OTHER PUBLICATIONS

M. Bolsen, et al.; "One Micron Lithography Using a Dyed Resist on Highly Reflective Topography", *Solid State Technology*, Feb. 1986.

*Primary Examiner*—Christopher G. Young
*Attorney, Agent, or Firm*—Robert L. Goldberg

[57] ABSTRACT

Reduction of reflection from an integrated circuit substrate during exposure of a photoresist layer on a surface such as an integrated circuit wafer is minimized by incorporating an antireflective coating between the photoresist layer and the integrated circuit substrate. The antireflective layer, after exposure and development of the photoresist layer, is preferably removed by exposing the non-masked antireflective layer to activating radiation while heating the coating to induce a solubilizing reaction in an antireflective coating and a curing reaction in an overlying photoresist mask. Thereafter, the exposed portions of the antireflective layer are removed by treatment with a suitable developer.

22 Claims, No Drawings

ANTIREFLECTIVE COATING PROCESS

BACKGROUND OF THE INVENTION

I. Introduction

This invention relates to reduction of reflection from a substrate surface during the processing of photoresists in integrated circuit manufacture. More particularly, this invention relates to antireflective coatings (ARC's) and a simplified process for use and removal of the same to provide an image of enhanced resolution.

II. Description of the Prior Art

It is known in the art that during the manufacture of integrated circuits, silicon wafers are coated with photoresist, exposed to activating radiation, and developed to define a relief image over the wafer surface. The relief image defines open areas over the substrate in a desired image pattern to be transferred to a substrate. The image is transferred to the surface of the substrate by surface modification of the substrate in a negative image of the pattern within the photoresist coating, such as by removal of a portion of the substrate surface by an etching process or by implantation of an atomic species into the substrate surface. During these processes, the coating of the photoresist in the image pattern functions as a protective mask to prevent surface modification of the substrate underlying the photoresist mask. The resolution of the image transferred to the substrate is dependent upon the resolution within the imaged photoresist coating.

There are factors in addition to the resolution capability of the photoresist used that influence the quality or resolution of the image transferred to a photoresist masked substrate. For example, with reflective integrated circuit substrates, such as aluminum, exposure of a photoresist coating causes reflection of diffused activating radiation (light) from the integrated circuit substrate back into the photoresist coating. Standard photoresists are susceptible to surface reflections which degrade the fine-line images required for integrated circuit manufacture. This degradation occurs due to reflection of diffused light from the integrated circuit substrate back into the photoresist layer resulting in exposure of the photoresist layer in areas where imaging is not desired.

To prevent reflection of activating radiation into a photoresist coating, it is known to provide antireflective layers (ARC's) between a substrate and a photoresist layer. These antireflective layers typically comprise an adsorbing dye dispersed in a polymer binder though some polymers contain sufficient chromophores whereby a dye is not required. When used, the dye is selected to adsorb and attenuate radiation at that wavelength used to expose the photoresist layer thus reducing the incidence of radiation reflected back into the photoresist layer. During the conventional processing of an integrated circuit substrate coated with the combination of an antireflective layer and a photoresist layer, the photoresist is exposed to activating radiation and developed to form a relief image, i.e., portions of the photoresist layer are removed by development with a liquid developer and portions remain as a mask defining a desired pattern. To alter the underlying substrate, the antireflective layer must be removed to bare the substrate in a desired image. Removal of the antireflective layer may be by dissolution with a liquid that simultaneously dissolves both the photoresist and the antireflective layer or by dry etching such as with an oxygen plasma.

In those processes using solely wet development, the developer used to develop the imaged photoresist layer also dissolves the underlying antireflective layer. However, simultaneous development of the photoresist coating and the underlying antireflective coating often leads to undercutting of the imaged photoresist coating caused by the developer seeping beneath those portions of the photoresist coating which are insoluble in developer. The seepage causes dissolution of the antireflective coating beneath the photoresist layer and partial lift-off of the photoresist coating at the relief image margins resulting in a loss of fine line image resolution.

To avoid undercutting of the antireflective coating during development of the photoresist coating, dry etching of the antireflective coating such as with an oxygen plasma has been used. In this process, the antireflective coating used is one that is insoluble in developer for the imaged photoresist. Therefore, contact of the imaged photoresist coating with the developer does not dissolve the underlying antireflective coating. Following development, the structure formed consists of the substrate coated with the antireflective layer overcoated with a photoresist in a desired relief image pattern which functions as a mask over the antireflective layer. Following development of the photoresist coating, the antireflective coating bared by removal of the photoresist is removed by dry etching the entire surface of the coated wafer, typically with an oxygen plasma to ash the antireflective layer and thereby form the desired relief image over the integrated circuit substrate. Details for plasma etching can be found in Elliott, *Integrated Circuit Fabrication Technology*, McGraw Hill Book Company, 1982, pp 259 to 308, incorporated herein by reference.

The process utilizing dry etching also suffers several disadvantages. One disadvantage is that the step of dry etching is an additional step requiring special equipment that adds to the overall processing sequence time and cost for the fabrication of the integrated circuit. Moreover, plasma etching is a blanket etching step whereby the photoresist mask and the antireflective coating are both exposed to the plasma. This often leads to degradation of the overlying photoresist coating resulting in an uneven and partially removed photoresist coating. Nonuniformity of the coating caused by a dry etch step increases variations in the delineated microcircuitry sizing following the etch. Reduction in the thickness of the mask comprising the photoresist and underlying delineated antireflective layer decreases the thickness of the coating available for masking the substrate.

In addition to difficulties encountered with removal of the antireflective coating, other problems are often encountered when an antireflective coating is used in combination with a photoresist coating. One such problem is that of carefully selecting an antireflective coating that is compatible with the photoresist used. The antireflective coating should be inert with respect to the photoresist coating while firmly bonding to the coating. It is desirable that the antireflective coating be chemically inert to avoid photoresist contamination caused by migration of chemical species from the antireflective coating into the photoresist coating that could alter or degrade the response of the photoresist to activating radiation and development. At the same time, it is necessary that the antireflective coating firmly bond to the photoresist coating to avoid lift-off of the photoresist coating during processing of the underlying substrate.

It is therefore an object of this invention to provide a process for preventing reflection of activating radiation by use of an antireflective coating where removal of the antireflective coating is by a process other than by dry etching or simultaneous wet development of both a photoresist layer and the antireflective layer.

A further object of this invention is to decrease reflection of light into a photoresist layer by use of a process whereby the thickness of an antireflective layer may be increased to make the same more opaque.

A still further object is to reduce the process cycle time for the manufacture of integrated circuits using antireflective coatings.

An additional object of this invention is to increase adhesion between an antireflective coating and a photoresist mask.

A primary object of this invention is to preserve the fine lines desired in an exposed and developed photoresist mask and in an image transferred to an underlying substrate.

Other objects and advantages will become apparent from the following more complete description and claims.

SUMMARY OF THE INVENTION

Broadly, the invention contemplates a process for reducing reflection from a substrate such as an integrated circuit substrate during imaging of a photoresist layer coated over said substrate using an antireflective coating. The process comprises the steps of providing a developer-insoluble antireflective coating over a substrate, providing a photoresist layer over said antireflective layer, imaging the photoresist layer by exposure and development of the same with a developer that does not dissolve the antireflective layer to form a relief image over the antireflective layer, altering the solubility properties of the antireflective layer in areas bared by removal of the photoresist using a combined step of exposure and heating, and removing the antireflective layer by contact with a solvent for the antireflective layer which does not appreciably attack or solvate the overlying hardened photoresist layer.

The above-described process is characterized by the steps of altering the solubility properties of the bared portions of the antireflective layer while heating and exposing the same without altering the dissolution properties of the antireflective coating masked by the photoresist coating. The step of heating accelerates the step of altering the dissolution properties of the antireflective coating by exposure to light, cures or hardens the photoresist mask overlying the antireflective coating, and enhances the bond between the antireflective coating and the photoresist mask. The process enables development of the antireflective layer without undercutting beneath the photoresist layer and without removing a portion of the overlying photoresist layer during the step of development while avoiding a dry etching step to remove the antireflective layer.

DESCRIPTION OF THE PREFERRED EMBODIMENTS

In the practice of the process of this invention, a substrate such as a silicon wafer is coated with an antireflective coating such as by spin coating. If required, the coated wafer may then be baked at elevated temperature to cure the coating. If heated, the coated wafer is allowed to cool and is coated with a photoresist composition such as by spin coating. The photoresist composition is then dried, exposed to activating radiation to form an acid catalyst in an image pattern, heating the photoresist to convert the exposed areas using a thermally activated catalytic reaction, and developed with a developer that does not dissolve the underlying antireflective coating. Following development, the unmasked or bared area of the antireflective coating is removed by altering its solubility properties using a heating step and dissolving the same in a suitable solvent.

In a preferred embodiment of the invention, to be described in greater detail below, solubility of the antireflective layer is altered by exposing the coating to activating radiation while heating the same to an elevated temperature. The temperature selected is one that accelerates chain scission of a developer-insoluble polymer comprising the antireflective layer to render the same developer soluble while simultaneously hardening or curing the overlying photoresist mask and enhancing the bond between the mask and the underlying antireflective layer. Heating is for a period of time sufficient to convert the developer-insoluble antireflective coating to a developer-soluble species while hardening the photoresist layer. Though the temperature is dependent upon the materials comprising the antireflective layer and the photoresist, in the preferred embodiment of the invention, the temperature is preferably in excess of 100° C. though lower temperatures may be used as will be described below. After the conversion of the antireflective layer, the hardening of the photoresist mask and the bonding of the photoresist mask to the antireflective layer, the antireflective coating is removed by contact with a developer such as an aqueous base solution. This step of development removes the antireflective coating in the non-masked areas thus exposing the integrated circuit substrate in a desired fine-line image pattern. Following this procedure, the substrate may be left unchanged or modified in a conventional manner.

The photoresist used in the above process is not critical though it should be selected to avoid intermixing or chem absorption with the antireflective layer as would be obvious to those skilled in the art and provided that it is capable of undergoing hardening or curing at elevated temperatures.

Suitable photoresist compositions are well known in the art and described in numerous publications including DeForest, Photoresist Materials and Processes, McGraw-Hill Book Company, New York, 1975. Photoresists comprise coatings produced from solution or applied as a dry film which, when exposed to light of the proper wavelength, are chemically altered in their solubility to certain solvents (developers). Two types are known. The negative-acting resist is initially a mixture which is soluble in its developer, but following exposure to activating radiation and in some cases, heat treatment, becomes insoluble in developer thereby defining an image. Positive-acting resists work in the opposite fashion, light exposure making the resist soluble in developer immediately following exposure, or in some cases following exposure and heat treatment.

The positive-working resists may comprise a light-sensitive compound in a film-forming polymer binder. The light-sensitive compounds most frequently used are esters formed from o-quinone diazide sulfonic acids. These esters are well known in the art and are described by DeForest, supra, pages 47–55, incorporated herein by reference. These light-sensitive compounds, and the methods used to make the same, are all well documented in prior patents including German Pat. No. 865,140 granted Feb. 2, 1953 and U.S. Pat. Nos. 2,767,092; 3,046,110; 3,046,112; 3,046,119; 3,046,121; 3,046,122; and 3,106,465, all incorporated herein by reference.

A class of negative resists comprising a negative-acting sensitizer in a polymer binder is described by Iwayanagi et al., *IEEE Transactions on Electron Devices*, Vol. ED-28, No. 11, November, 1981, incorporated herein by reference. The resists of this reference comprise an aromatic azide in a phenolic binder. It is believed that these resists were first disclosed and claimed in U.S. Pat. No. 3,869,292, also incorporated herein by reference. Additional aromatic azide sensitizers are disclosed by DeForest, supra, and U.S. Pat. Nos. 2,940,853 and 2,852,379, incorporated herein by reference.

The resin binders most frequently used with the o-quinone diazides in commercial practice are the alkali-soluble phenol formaldehyde resins known as the novolak resins. Photoresists using such polymers are illustrated in U.K. Pat. No. 1,110,017, incorporated herein by reference. These materials are the product of reaction of a phenol with formaldehyde under conditions whereby a thermoplastic polymer is formed with a glass transition temperature of about 100° C.

Most of the above photoresists are imaged by exposure to I-Line or G-Line irradiation. Recently interest has increased in photoresists that can be photoimaged with deep ultraviolet radiation. Such photoresists enable formation of smaller features than possible at longer wavelength exposure. As is recognized by those in the art, "deep U.V. radiation" refers to exposure radiation having a wavelength in the range of about 350 nm or less, and more typically is in the range of about 300 nm or less. A photoresist formulation suitable for deep U.V. exposure is disclosed in U.S. Pat. No. 5,344,742, incorporated herein by reference. Photoresists capable of imaging by exposure to deep U.V. radiation and processes using such photoresists are preferred for purposes of this invention.

Antireflective coating compositions and their uses are also known in the art and are described in numerous articles such as in the *IEEE Transactions on Electron Devices*, Edition 28, No. 11 of Nov. 1981, pages 1405 through 1410, entitled "Line Width Control and Projection Lithography Using a Multi-Layer Resist Process" by O'Toole et al. and in "Reduction of the Standing Wave Effect in Positive Photoresist," Brewer et al. in *Journal of Applied Photographic Engineering*, Vol. 7, No. 6, Dec. 1981, pages 184 through 186, and "Control of One-Micron Lines in Integrated Circuits," Carlson et at., *Kodak*, '80 Interface, Oct. 1980, pages 109 through 113, and in U.S. Pat. Nos. 4,370,405; 4,668,166; 4,719,166; 4,828,960; 4,910,122; and 5,234,990, each incorporated herein by reference.

Typical antireflective coatings comprise an adsorbing dye dispersed in a suitable polymer binder in an amount sufficient to attenuate the reflection of activating radiation into a photoresist coating. In some formulations, the resin binder contains sufficient chromophores to enable adsorption of activating radiation without the use of a separate dye. Typically, when a dye is added, it is used in an amount of about 0.1 to 10 grams per liter of coating composition and more preferably, in an amount of from 1 to 5 grams per liter of coating composition. In selection of the dye, care should be exercised to assure that the dye is compatible with the photoresist used and is thermally stable at processing temperatures used. Further, the dye shall be non-volatile at the temperature used and must adsorb reflective radiation at the radiation wavelength used to expose the photoresist. Among the dyes which may be used are 2-(P-(dimethylamino) phenylazo) benzoic acid (Methyl red), 4-(phenylazo) resorcinol (Sudan orange) and di-n-butyl-(5-di-n-butylamino-2,4-pentadienylidene)-ammonium perchlorate. Polymers that may be used with or without dyes include aromatic urea sulfone and aromatic sulfone polymers.

The antireflective coating selected is one capable of having its dissolution properties altered following development of the overlying photoresist coating. A lesser preferred method of altering dissolution properties is to add a photoactive compound to the antireflective coating responsive to activating radiation at a wavelength differing from the radiation used to image the photoresist coating. For example, if the photoresist is one imaged by exposure to deep ultraviolet radiation, the photoactive compound used may be one activated by I-Line or G-Line irradiation. In this way, exposure of the photoresist would not alter the dissolution properties of the underlying antireflective layer. Following exposure and development of the photoresist, the antireflective layer bared by removal of the photoresist coating would be imaged using radiation at that wavelength capable of altering the dissolution properties of said layer.

In an alternative embodiment of the invention, an antireflective coating photoresist combination can be used where the antireflective coating undergoes chain scission at a wavelength where the photoresist is opaque. For example, an I-Line or G-Line activated photoresist can be used with an antireflective coating which undergoes chain scission at deep ultraviolet exposure. In this embodiment of the invention, the photoresist would be exposed to I-Line or G-Line irradiation, for example, and developed baring the underlying antireflective coating. The antireflective coating would then be exposed to irradiation with heating to cause chain scission such as deep ultraviolet irradiation, but which would not enhance the dissolution of the overlying photoresist. Thereafter, the antireflective coating could be altered by contact with a suitable developer.

In a preferred embodiment of the invention, the antireflective coating is one capable of undergoing chain scission by exposure to activating radiation to alter its solubility properties. Typically, chain scission is accelerated at elevated temperatures. Consequently, exposure of the antireflective coating takes place at an elevated temperature, especially those elevated temperatures that simultaneously harden or cure an overlying photoresist mask and enhance the bond between the mask and the antireflective coating. Further, it is desired that the antireflective coating is one that undergoes chain scission by exposure to radiation at a wavelength that is the same wavelength used to cross-link the photoresist coating thus avoiding the need for two imaging tools. The preferred embodiment of the invention described above is possible with a combination of either a positive-acting thermally-activated chemically-amplified photoresist or that acid hardened deep ultraviolet photoresist that is the subject of U.S. Pat. No. 5,344,742 and those preferred polysulfone antireflective coating compositions disclosed in U.S. Pat. No. 5,234,990, especially that polysulfone that is a copolymer of 4,4'-isopropylidenediphenol and 4-chlorophenylsulfone. These materials are preferred because it has been discovered that the polysulfone antireflective coatings are converted from base insoluble to base soluble coatings by exposure to radiation within a broad band of from about 250 to 450 nm while heating to a temperature of 20° C. or higher. The chemically amplified photoresists and the acid-hardened photoresists do not appreciably solubilize at temperatures below 50° C., solubilize at temperatures between about 50° C. and 100° C., and cure or harden at temperatures above 100° C. Consequently, antireflective coatings formed from these polysulfones coated with either an imaged positive-acting thermally-activated chemically-amplified photoresist or an acid-hardened deep ultraviolet photoresist can be exposed to radiation within the range of 250 to 450 nm while heating to a temperature of from about 20° C. to 50° C. or at a temperature of in excess of 100° C., typically up to about 200° C. or that temperature that causes thermal degradation of either the antireflective coating or the photoresist mask. Accordingly, when the polysulfone antireflective coating is used in combination with the acid-hardened deep ultraviolet photoresist coating, the photoresist may be exposed and developed with a developer that does not solubilize the antireflective coating formed from the polysulfone to form a mask over the antireflective coating, the bared antireflective coating is exposed such as by blanket exposure to irradiation within the range of from 250 to 450 nm while heating, and then the bared antireflective coating is removed by contact with a solution of an aqueous base such as a conventional photoresist developer. The exposure is to a wavelength that converts the base insoluble antireflective coating to a base soluble material. Exposure of the antireflective coating to the shorter wavelengths (below 380 nm) enhances the chain scission of the antireflective coating but also tends to deblock the blocking groups of the photoresist tending to solubilize the same thereby requiring higher temperatures for cure of the photoresist layer to overcome the effect of deblocking on solubility of the photoresist. Exposure to the higher wavelengths (380 nm and above) does not cause deblocking within the photoresist mask and lower temperatures may be used to cure the photoresist coating. The developer may be an aqueous alkaline 0.1N to 0.5N solution of tetramethyl ammonium hydroxide.

The above-referenced U.S. Pat. No. 5,234,990 discloses that exposure of a composite of the polysulfone and the photoresist to activating radiation permits development of both during the step of development of the photoresist. However, to accomplish this, the exposure dose must be excessive or the antireflective layer must be thin in order to cause adequate scission of the polysulfone layer whereby it becomes base soluble. An excessive exposure dose overexposes the photoresist resulting in a loss of image quality. A thin antireflective layer inadequately attenuates reflected light from the substrate. Consequently, the invention described herein differs from the invention of said patent by use of an exposure dose sufficient to expose the photoresist but insufficient to significantly solubilize the antireflective layer.

As a further advantage to the invention, it has been found that the heating step during exposure of the antireflective layer also improves the bond between the antireflective layer and the photoresist mask. This is an advantage to the process, both during the step of development of the antireflective layer and during the subsequent steps of altering the underlying wafer.

The antireflective coating and photoresist layer may be applied sequentially to a substrate in a conventional manner. Each may be spin coated or roller coated as a liquid coating composition onto a suitable substrate. Following the step of coating the liquid coating composition onto the substrate, the coating is dried by heating the same to a suitable drying temperature such as about 100° C. for a time sufficient to remove substantially all solvent and provide a non-tacky coating layer. Typically, the average thickness of the antireflective coating may range between about 750 and 1,300 Angstroms and the photoresist coating may vary between 4,000 and 12,000 Angstroms dependent upon the masking requirements of the photoresist.

The invention will be better understood by reference to the following example.

EXAMPLE

A 200 mm clean silicon wafer was primed with hexamethyldisilizane. The prepared wafer was coated by spin coating with Brewer CD9 antireflective coating and cured at 224° C. for 60 seconds to form a coating having a thickness of 1100 Angstroms. The Brewer antireflective coating comprised a polysulfone in a coating solvent. Thereafter, the dried antireflective coating was coated with a deep ultraviolet photoresist obtained from Shipley Company LLC and identified as APEX-E deep ultraviolet photoresist. The wet coating was dried and post-exposure baked at 100° C. for 60 seconds to provide a coating having a thickness of about 10,000 Angstroms. The dried photoresist coating was then exposed using a GCA XLS 0.53 numerical aperture through a 248 nm deep ultraviolet stepper. The composite coated with the exposed photoresist coating was then hot-plate baked at 90° C. for 60 seconds. The exposed photoresist coating was spray and double-puddle developed using 0.21 normal tetramethyl ammonium hydroxide solution containing proprietary surfactants for 60 seconds at 22° C. to yield a relief image in the photoresist coating with the underlying antireflective layer bared in the recesses. The developer used was obtained from Shipley Company LLC and sold under the trade designation MF-321 Developer. Following development, the coated wafer was subjected to a ultraviolet irradiation and thermal cured using a Fusion Systems H-modified lamp. Temperature was adjusted to 110° C. while the lamp was turned on at low power for 10 seconds while maintaining the temperature at 110° C. The lamp was then turned to high power, and the temperature ramped upward from 110° C. to 160° C. using a 35-second linear ramp rate. Following this step of exposure and heating, the exposed antireflective coating was removed by spray and double-puddle development using the Shipley Company LLC MF-321 Developer for 60 seconds at 22° C. to provide a relief image in both the photoresist coating and the antireflective coating. The lines within the relief image of the photoresist and antireflective coating were 0.35 microns and smaller. Following transfer of the image to the underlying substrate, the composite of the photoresist and antireflective coating is removed by dry etching with oxygen or by solvent dissolution.

We claim:

1. A process for reducing reflection from a substrate during imaging of a photoresist layer, said process comprising the steps of forming an antireflective, radiation-adsorbing coating over a substrate; applying a radiation-sensitive photoresist layer over said antireflective coating, said antireflective coating being capable of adsorbing activating radiation for said photoresist layer thus decreasing reflection of the same back into the photoresist layer; exposing said photoresist layer to activating radiation in an image pattern to form a latent image therein without formation of a developable latent image in the antireflective coating, developing said photoresist layer with a developer that is incapable of dissolving said antireflective coating to form a relief image in said photoresist layer, altering the dissolution properties of the antireflective coating; and dissolving said antireflective coating in a solvent therefor without appreciably dissolving the photoresist layer to bare the underlying substrate in an image pattern.

2. The process of claim 1 where the composite of the substrate, antireflective coating and photoresist layer are heated to elevated temperature during the step of altering the dissolution properties of the antireflective coating.

3. The process of claim 2 where the photoresist layer is one activated by exposure to deep ultraviolet irradiation and the antireflective coating is one that adsorbs deep ultraviolet irradiation.

4. The process of claim 2 where the photoresist layer is a positive-working photoresist.

5. The process of claim 2 where the photoresist layer is a negative-acting photoresist.

6. The process of claim 2 where the exposed photoresist layer containing a latent image is soluble in an aqueous base solution and the antireflective coating is insoluble in said aqueous base solution.

7. The process of claim 2 where the antireflective coating is altered to render the same soluble in an aqueous base solution.

8. The process of claim 7 where the antireflective coating is altered in its dissolution properties by heating said coating while exposing the same to radiation capable of causing chain scission of said coating.

9. The process of claim 8 where the antireflective coating and the photoresist layer are heated to a temperature capable of accelerating the rate of alteration of said antireflective coating and curing the photoresist layer to render said layer insoluble in developer for the antireflective coating.

10. The process of claim 9 where the temperature varies between 20° C. and that temperature that would insolubilize the photoresist layer in developer for the antireflective coating.

11. The process of claim 9 where the temperature varies between 100° C. and that temperature that would degrade the photoresist layer.

12. The process of claim 11 where the maximum temperature is 200° C.

13. The process of claim 8 where the antireflective coating is exposed to a wavelength of below 380 nm.

14. The process of claim 8 where the antireflective coating is exposed to a wavelength of from 190 nm to 230 nm.

15. A process for reducing reflection from an integrated circuit substrate during imaging of a photoresist layer, said process comprising the steps of forming a polysulfone coating capable of adsorbing deep ultraviolet radiation over an integrated circuit substrate; applying a deep ultraviolet radiation-sensitive photoresist layer over said polysulfone coating; exposing said photoresist layer to deep ultraviolet radiation in an image pattern to form a latent image therein without formation of a developable latent image in the polysulfone layer; developing said photoresist layer with an aqueous alkaline developer that is incapable of dissolving said polysulfone coating to form a relief image in said photoresist layer; altering the dissolution properties of the polysulfone coating and the photoresist layer by exposing the same to deep ultraviolet irradiation while heating the same to render the polysulfone coating base soluble and cure the photoresist layer to thereby decrease its base solubility; and dissolving said polysulfone coating in an aqueous alkaline developer solution to bare the underlying substrate in an image pattern.

16. The process of claim 15 where the photoresist layer is of a negative-working photoresist.

17. The process of claim 15 where the photoresist layer is of a positive-working photoresist.

18. The process of claim 17 where the positive-working photoresist is a chemically amplified or acid-hardened photoresist.

19. The process of claim 17 where the antireflective coating and photoresist layer are heated to a temperature of from 20° C. to that temperature that would degrade the photoresist layer without solubilizing the photoresist layer in developer for the antireflective coating.

20. The process of claim 19 where the temperature varies between 20° C. and 50° C. or from 100° C. to 200° C.

21. The process of claim 15 where the antireflective coating is exposed to a wavelength of below 380 nm.

22. The process of claim 15 where the antireflective coating is exposed to a wavelength of from 190 nm to 230 nm.

* * * * *